United States Patent
Franken et al.

(10) Patent No.: US 10,329,668 B2
(45) Date of Patent: Jun. 25, 2019

(54) DEVICE AND METHOD FOR EXHAUST GAS TREATMENT ON CVD REACTOR

(71) Applicant: AIXTRON SE, Herzogenrath (DE)

(72) Inventors: Patrick Franken, Eschweiler (DE); Markus Deufel, Aachen (DE)

(73) Assignee: AIXTRON SE, Herzogenrath (DE)

(*) Notice: Subject to any disclaimer, the term of this patent is extended or adjusted under 35 U.S.C. 154(b) by 610 days.

(21) Appl. No.: 14/686,615

(22) Filed: Apr. 14, 2015

(65) Prior Publication Data
US 2015/0292083 A1 Oct. 15, 2015

(30) Foreign Application Priority Data
Apr. 14, 2014 (DE) .................. 10 2014 105 294

(51) Int. Cl.
*C23C 16/44* (2006.01)

(52) U.S. Cl.
CPC .......... *C23C 16/4412* (2013.01); *Y02C 20/30* (2013.01); *Y02P 70/605* (2015.11)

(58) Field of Classification Search
CPC .... C23C 16/4412; Y02P 70/605; Y02C 20/30
USPC ......................... 427/248.1–255.7
See application file for complete search history.

(56) References Cited

U.S. PATENT DOCUMENTS

| 4,817,557 A | 4/1989 | Diem et al. |
| 7,647,886 B2 | 1/2010 | Kubista et al. |
| 2005/0081786 A1* | 4/2005 | Kubista ............... C23C 16/4412 118/715 |
| 2007/0207625 A1 | 9/2007 | Aggarwal et al. |
| 2009/0020227 A1* | 1/2009 | Andou .............. H01L 21/67017 156/345.37 |
| 2012/0304930 A1 | 12/2012 | Verdict et al. |
| 2013/0237063 A1 | 9/2013 | Varadarajan et al. |

* cited by examiner

*Primary Examiner* — Michael P Wieczorek
*Assistant Examiner* — Michael G Miller
(74) *Attorney, Agent, or Firm* — Ascenda Law Group, PC

(57) ABSTRACT

A first and second process gas is fed into a device during a first and second process step, respectively. The device has an exhaust gas line through which a first and second exhaust gas is conveyed out of the device in the first and second process step, respectively. A first and second exhaust gas device is connected by means of a valve arrangement optionally to the exhaust gas line in a fluidly communicable and separable manner, with a first and second treatment member for treating an exhaust gas produced in the first and second process step, respectively. A gas feed device is arranged between the valve arrangement and the respective treatment members. A control device is provided whose control variable is the pressure difference between the total pressure in the respective exhaust gas devices and is configured to minimize the pressure difference during switching of the valve arrangement.

4 Claims, 5 Drawing Sheets

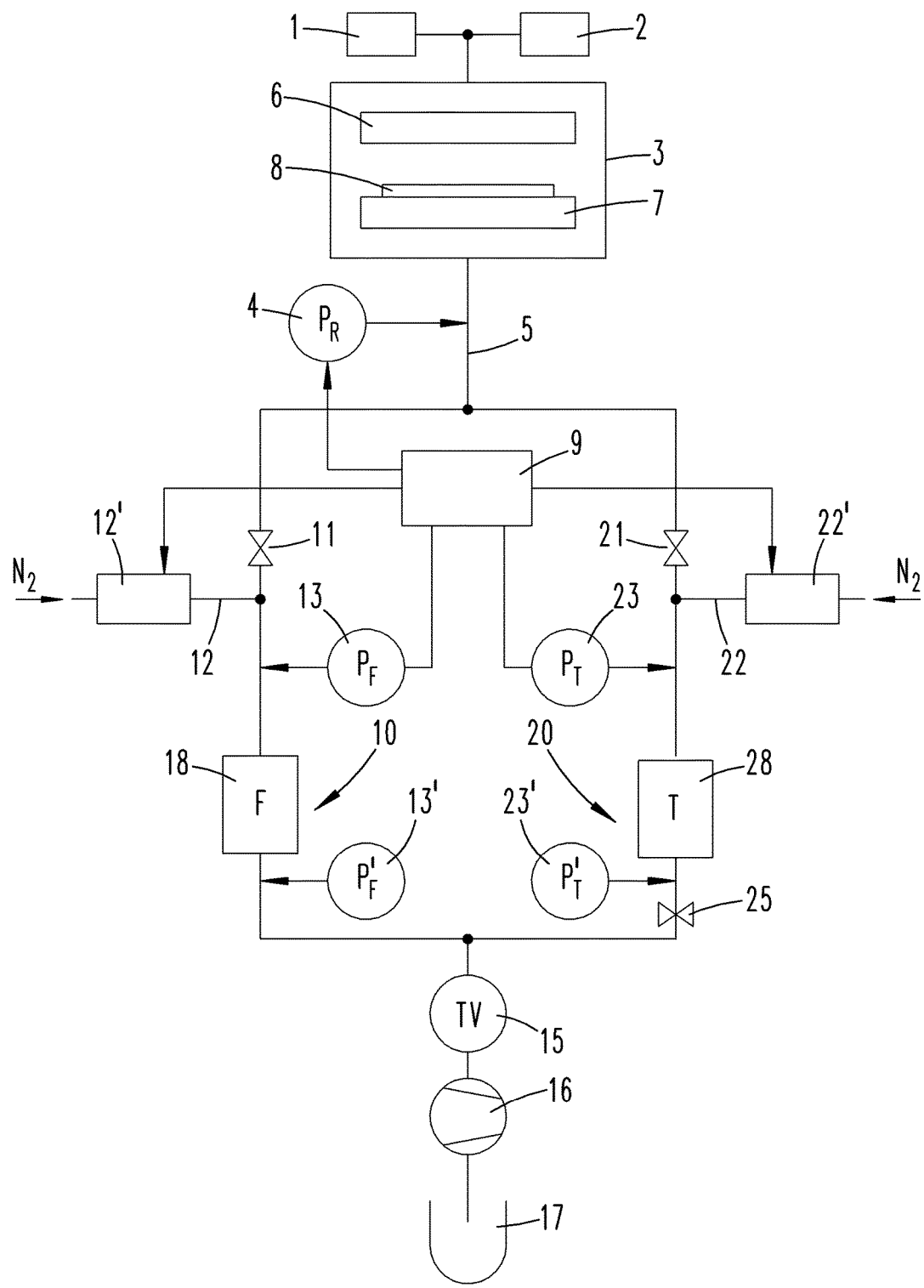

DEVICE AND METHOD FOR EXHAUST GAS TREATMENT ON CVD REACTOR

RELATED APPLICATIONS

This application claims priority to DE Application 10 2014 105 294.3 filed 14 Apr. 2014 which is incorporated herein by reference.

BACKGROUND

Device with a reactor in which process gases different from one another can be fed in during process steps different from one another and methods in which process gases different from one another are fed into a reactor during process steps different from one another are known from the prior art. For instance, U.S. Pat. No. 7,647,886 B2 has a process chamber into which process gases different from one another are fed in from several gas sources in process steps different from one another. The process gases pass through a gas inlet member into the process chamber. A substrate to be coated is located in the process chamber on a heated susceptor. The processes gases are broken down, particularly pyrolytically, and form a coating and an exhaust gas. The exhaust gas passes through an exhaust gas line from the process chamber and is treated in a first exhaust gas device, which is an exhaust gas treatment device. When a second process gas is used, for example a treatment gas with which coatings that are parasitic to the process gas are to be etched off of the walls, a second exhaust gas device is used which is also an exhaust gas treatment device. The two exhaust gas treatment devices have treatment members that are different from one another in which a respective exhaust gas or reaction product is filtered out.

A device having two exhaust gas devices is described in US 2007/0207625 A1. Each of the two exhaust gas devices has a pump and a gas treatment in the form of a scrubber. In this device, flushing gases can be fed into the two exhaust gas devices.

A device and method are known from US 2012/0304930 A1 in which two exhaust gas devices arranged parallel to each other are used, each of which has a cooling trap and a pressure control valve.

An arrangement of exhaust gas treatment devices having two pumps and a common treatment device is also described by US 2013/0237063 A1.

U.S. Pat. No. 4,817,557 describes a process chamber arrangement for executing a CVD process in which a ballast gas can be fed in through an exhaust gas line via a mass flow controller with which the total pressure in the process chamber can be varied or controlled while the suction power of the pump arrangement is maintained at a set value.

SUMMARY OF THE INVENTION

During operation of a CVD reactor, a process gas is fed into the process chamber of the CVD reactor through a gas inlet member. The process gas can consist of individual gases reacting with each other; for example, the process gas can have an organometallic III component and a III hydride. For example, an organometallic gallium compound, an organometallic indium compound or an organometallic aluminum compound can be fed into the process chamber. For the deposition of III-V layers, a hydride such as arsine, phospine or ammoniac, for example, is fed in. The chemical reaction products form a preferably monocrystalline layer on the substrate resting against a heated susceptor in the process chamber. Gaseous reaction products or even intact process gases are discharged through an exhaust gas line from the process chamber located within the gas-tight reactor. During the growth step, a first exhaust gas device is connected to a first treatment member, for example a particle filter, with the exhaust gas line. In the particle filter, particles are filtered out that form in the process chamber or in the gas discharge through a reaction of the process gases with each other. During the deposition process, only one layer forms on the one or more substrates. Parasitic coatings form on the walls of the process chamber as well and particularly on the portions of the surface of the heated susceptor not covered by the substrates. In a treatment step that is performed after the coating step, after the substrates have been removed from the process chamber, a treatment gas is introduced into the process chamber. Typically, the treatment gas is chlorine. With the treatment gas, the parasitic coatings on the surfaces of the walls or on the susceptor of the process chamber are removed. Not only does the reaction product between the treatment gas and the coatings, such as a gallium chloride, for example, flow through the exhaust gas line, but also $Cl_2$. To prevent a reaction of the treatment gas with the residues in the filter and to remove the treatment gas from the exhaust gas flow, the first exhaust gas device is separated from the exhaust gas line by means of a valve arrangement. By means of the valve arrangement, a second exhaust gas device is connected to the exhaust gas line in which a second treatment member is arranged. A cooling trap cooled to 77° K can be used, for example, to freeze out the treatment gas. In such a method and with such a device, the valve arrangement is used alternatingly to connect either the first exhaust gas device or the second exhaust gas device to the exhaust gas line. However, crosstalk can occur when switching. This means, for example, that chlorine gas penetrates into the exhaust gas treatment device that is used for cleaning the process gas during the deposition process or that $NH_3$ enters the exhaust gas treatment device that is used to freeze out the treatment gas. In both cases, this results in a reaction of Cl with $NH_3$ into $NH_4Cl$ and thus a reduction of the durability of the treatment members. Such cross-contamination occurs in a device belonging to the prior art when, for safety reasons, both check valves are open for a short time during switching of the valve arrangement with which the respective exhaust gas device is connected to the exhaust gas line.

It is the object of the invention to improve a device and a method for the exhaust gas treatment of a CVD device in a practically advantageous manner.

The object is first achieved by a device with a reactor into which process gases different from one another can be fed during process steps different from one another and having an exhaust gas line through which the exhaust gases different from one another can be conveyed out of the reactor in process steps different from one another, with a first exhaust gas device that can be connected by means of a valve arrangement to the exhaust gas line in a fluidly communicable and separable manner, with a first treatment member for treating an exhaust gas produced in a first of the process steps different from one another, with a first gas feed device arranged between the valve arrangement and the first treatment member for feeding in a first equalizing gas, with a first pressure sensor for determining the total pressure in the first exhaust gas device and, particularly, a first mass flow controller for adjusting the mass flow of the equalizing gas, and with a second exhaust gas device that can be connected by means of the valve arrangement to the exhaust gas line in a fluidly communicable and separable manner, with a second treatment member for treating an exhaust gas produced in a second of the process steps different from one another, with a second gas feed device arranged between the valve arrangement and the second treatment member for feeding in a second equalizing gas, with a second pressure sensor for determining the total pressure in the second exhaust gas device and, particularly, with a second mass flow controller for adjusting the mass flow of the second equalizing gas, a control device being provided whose control variable is the pressure difference between the total pressure in the first exhaust gas device and the total pressure in the second exhaust gas device and is set up such that the pressure difference is initially regulated toward zero upon switching of the valve arrangement.

The object is further achieved by a method and a control program stored in a data storage for the operation of a reactor into which, in process steps different from one another, process gases different from one another are fed and in which, in the process steps different from one another, exhaust gases different from one another are conducted through an exhaust gas line out of the reactor, a first exhaust gas device being fluidly connected by means of a valve arrangement to the exhaust gas line in a first process step and at least one second exhaust gas device being separated therefrom, the first exhaust gas being treated with a first treatment member of the first exhaust gas device and a first equalizing gas being fed in by means of first gas feed device particularly having a first mass flow controller between valve arrangement and the first treatment member and the total pressure in the first exhaust gas device being determined with a first pressure sensor, a second exhaust gas device being fluidly connected in a second process step by means of the valve arrangement to the exhaust gas line and at least the first exhaust gas device being separated therefrom, the second exhaust gas being treated with a second treatment member of the second exhaust gas device and a second equalizing gas being fed in by means of a second gas feed device particularly having a second mass flow controller between the valve arrangement and the second treatment member and the total pressure in the second exhaust gas device being determined with a second pressure sensor, the pressure difference between the total pressure in the first exhaust gas device and the total pressure in the second exhaust gas device initially being adjusted toward zero by means of a control device during the switching of the valve arrangement. In a preferred variant of the invention, a pressure sensor is provided with which the total pressure in the process chamber can be determined. Moreover, at least one vacuum pump is provided with which the process chamber can be evacuated through one of the exhaust gas devices. A throttle valve is located upstream from the at least one vacuum pump. The throttle valve has a servomotor that is driven by the control device. The opening cross section of the throttle valve and hence the pump output can be varied using the servomotor. During the process step, the total pressure measured by the pressure sensor within the process chamber is adjusted to a target value, for example, by varying the position of the throttle valve. However, the mass flow of the equalizing gas, which acts as a ballast gas here, can also be used to regulate the total pressure in the process chamber. The method described above is applied during the switch from one process step to the next process step. By varying the position of the throttle valve and/or by varying the mass flow of the equalizing or ballast gas into the two exhaust gas devices, the total pressures therein are adjusted to a common value at the beginning of the switching phases. This is done during an operating position in which an exhaust gas device with an open check valve to the gas discharge and the other exhaust gas device is separated by a closed check valve from the exhaust gas line. After a stabilization of the total pressures in the two exhaust gas devices, the previously closed check valve is opened, so that both exhaust gas devices are fluidly connected to the exhaust gas line. By virtue of the total pressure in the two exhaust gas devices being held to a common value, the cross flow that posed a nuisance in the prior art is avoided. At the same time, however, it is ensured that the process chamber is evacuated without interruption, since there is no point in time in which all of the check valves are closed. Shortly after the opening of the check valve, for example of the second exhaust gas device, the check valve of the first exhaust gas device is closed. In the subsequent process step, the control device cooperates again with the pressure sensor determining the total pressure in the process chamber in order to maintain the total pressure in the process chamber at a target value. Since check valves are generally not 100 percent tight, the pressure difference between the total pressures in the two exhaust gas devices is also kept as constant as possible during the process steps, particularly by varying the mass flows of the first and/or second equalizing gas. In the exhaust gas device that is separated from the exhaust gas line, the pressure regulation can be done by varying the mass flow of the supplied equalizing gas. The equalizing gas is preferably an inert gas, for example nitrogen. However, hydrogen or a suitable noble gas can also be used. The feed is done in an area of the exhaust gas member that lies between the valve arrangement and the respective treatment member. It is in this area that the determination of the total pressure preferably also occurs. The treatment member can be a particle filter. However, it can also be a cooling trap. Preferably, the first treatment member is a particle filter and the second treatment member is a cooling trap for freezing out chlorine. A pressure sensor can also be arranged downstream from the treatment member. This pressure sensor measures a total pressure that has been reduced as a result of the pressure drop in the treatment member. Each of the one or more exhaust gas devices can have a throttle valve with which the pump output of a vacuum pump arranged downstream from the throttle valve in the direction of flow can be regulated. In order to regulate the total pressure within the exhaust gas device, the throttle valve can be held in a fixed valve position. As a result, the pump operates at a constant delivery rate. It is also possible, however, to regulate the total pressure with the aid of the respective throttle valve and to feed a constant ballast flow into the exhaust gas device. In a preferred variant of the invention, at the beginning of the switching phase, the equalizing gas flow into the exhaust gas device that is still separated from the exhaust gas line but is to be connected to the exhaust gas line at the end of the switching phase, is increased to a level corresponding to the gas flow flowing through the exhaust gas device that is still connected to the exhaust gas line at the beginning of the switching phase but will be separated from the exhaust gas line upon completion of the switching phase. Both exhaust gas devices each have a throttle valve with which the total pressure in the process chamber can be adjusted. These two throttle valves then have about the same valve position immediately before the opening of the closed check valve. Therefore, after the opening of the previously closed check valve and the closing of the previously open check valve, only the equalizing gas flow into the exhaust gas device now connected to the exhaust gas line needs to be reduced, which can be done fast with an adjustment of the throttle valve. This leads to an only a slight pressure increase within the process chamber when the check valve is closed. The regulation of the total pressure within the exhaust gas device is done by determining the total pressure by means of the pressure sensor and the control device, which varies the mass flow of the equalizing gas via the mass flow controller. In one variant of the invention, a provision can be made that only one vacuum pump is present to which the two or more exhaust gas devices are connected. Furthermore, a provision can be made that each of the exhaust gas devices individually has a vacuum pump, it being possible for the vacuum pump to be arranged upstream or downstream from the treatment member. However, the determination of the total pressure is made immediately downstream from the valve arrangement in any case, thus preventing the formation of cross flows in an open position of all of the valves of the valve arrangement. Each of the two or more exhaust gas devices can have an individual check valve that is part of the valve arrangement. The exhaust gas device is connected to the exhaust gas line of the reactor upstream from the check valve. Preferably, at least one gas treatment is provided in the form of a scrubber. A common scrubber can be provided that cleans any gas flows emerging from the vacuum pumps or the vacuum pump. A provision is also made, however, that each of the exhaust gas devices has its individually associated scrubber. Furthermore, a provision can be made that each exhaust gas device has a throttle valve. However, a provision can also be made that at least one exhaust gas device has no adjustable throttle valve but only a fixed throttle, so that the total pressure within this exhaust gas system is adjusted exclusively via the equalizing gas.

BRIEF DESCRIPTION OF THE DRAWINGS

Exemplary embodiments of the invention are explained below with reference to the enclosed drawings.

FIG. 5 shows a fifth exemplary embodiment, in which only one adjustable throttle valve 15 is provided and a fixed-value throttle 25 sits in the exhaust gas treatment device 20.

DETAILED DESCRIPTION

Figure 1:
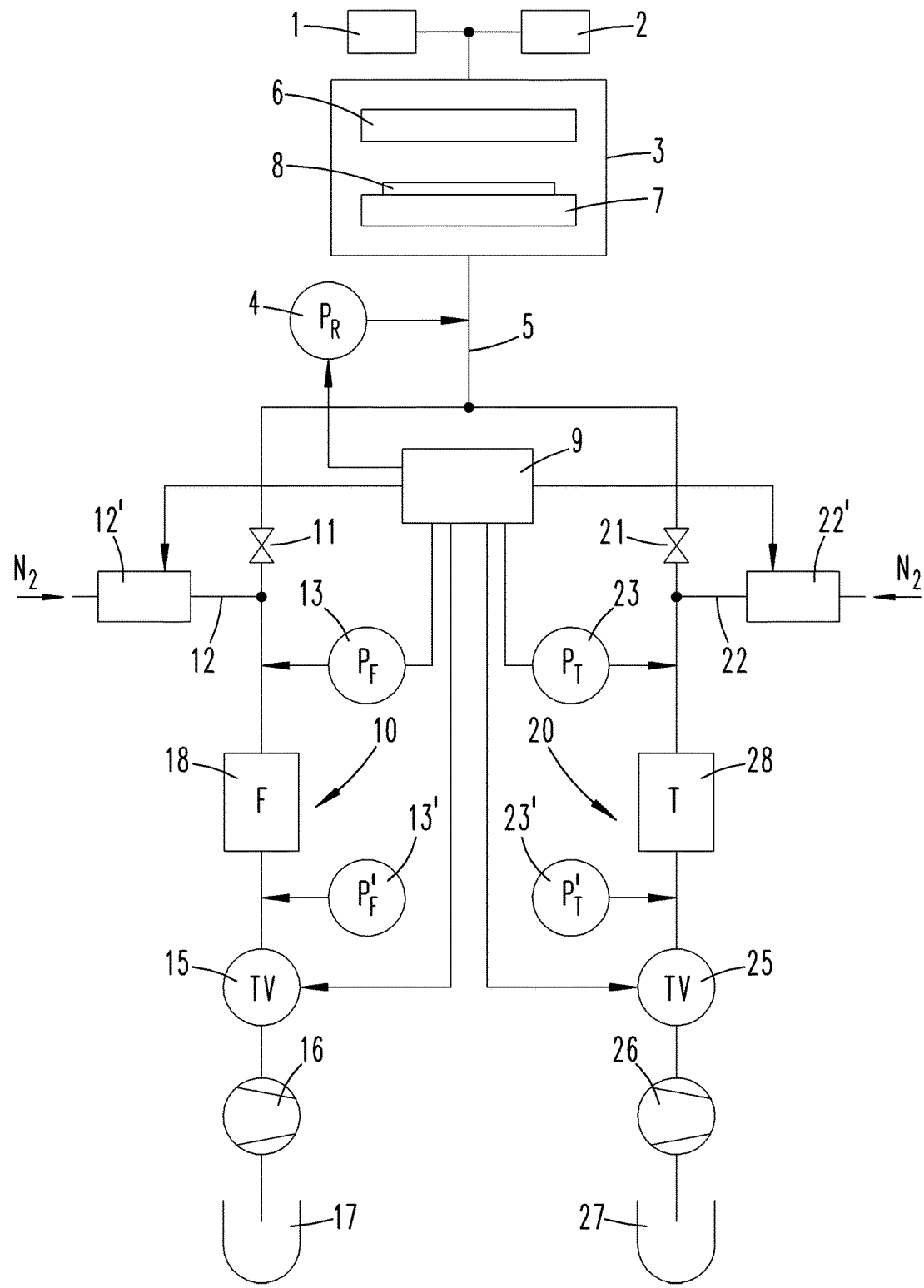
FIG. 1 shows, as a block diagram, a first exemplary embodiment with two exhaust gas treatment devices 10, 20 arranged parallel to one another.

The exemplary embodiments describe an exhaust gas treatment device for treating the different exhaust gases that are produced during execution of a CVD growth process. The CVD growth process takes place in a reactor 3. The reactor 3 is a housing that is sealed in a gas-tight manner toward the outside in which a gas inlet member 6 is located. The shower head-like gas inlet member 6 has gas outlet openings through which the process gases made available by gas sources 1, 2, 2' enter a process chamber whose floor is formed by a heated susceptor 7. One or more substrates 8, for example III-V-substrates or also IV-substrates, for example silicon substrates, lie on the susceptor 7. III-V layers, for example gallium arsenide, indium arsenide, indium phosphide or gallium nitrite layers are deposited on the substrates 8. Very generally, layers are deposited within the process chamber that contain gallium, indium, aluminum, phosphorous, arsenic and/or nitrogen. The layers can also be doped with dopants. Process gases in the form of organometallic compounds or hydrides, for example $NH_3$, are used. The process gases are introduced together with a carrier gas through the gas inlet member into the process chamber. Hydrogen, nitrogen or a noble gas can be used as a carrier gas.

After the deposition of layers having one or more different compositions onto the substrates 8 and removal of the substrates 8 from the process chamber, the process chamber must be cleaned. To do this, a treatment gas is fed into the process chamber. One typical treatment gas is chlorine. The treatment gas is fed into the process chamber together with a carrier gas. When using chlorine, nitrogen is particularly used as the carrier gas.

The process gases or exhaust gases are conducted through an exhaust gas line 5 out of the reactor 3. A pressure sensor 4 is located in the exhaust gas line 5 in order to measure the total pressure $P_R$ within the exhaust gas line and within the process chamber. The exhaust gas line 5 branches into a first check valve 11 of a first exhaust gas device 10. This is an exhaust gas treatment device having a treatment member 18 in the form of a particle filter. A gas feed point 12 for feeding in an equalizing gas, for example $N_2$, is located immediately downstream from the first check valve 11. The mass flow of the equalizing gas can be regulated via a mass flow controller 12'. A pressure sensor 13 with which the total pressure $P_F$ within the exhaust gas device 10 can be measured is located immediately downstream from the check valve 11, that is, between treatment member 18 and check valve 11. This is preferably the total pressure immediately downstream from the check valve 11.

The total pressure $P'_F$ downstream from the treatment member 18 can be determined by means of a second pressure sensor 13'.

An adjustable throttle valve 15 with which the suction power of the vacuum pump 16 arranged downstream from the throttle valve 15 can be adjusted is located downstream from the treatment member 18. A scrubber 17 for gas treatment is located downstream from the vacuum pump 16.

The exhaust gas line 5 also branches into a second exhaust gas device 20 having a similar structure as the first exhaust gas device 10. It has a second check valve 21 and a second feed point 22 for feeding in the equalizing gas, the mass flow of which is adjusted via a second mass flow controller 22', that is arranged immediately downstream from the check valve 21. The total pressure $P_T$ immediately downstream from the second check valve 21 is determined by means of a second pressure sensor 23. Using the check valve 21, which can be actuated independently of the check valve 11, the second exhaust gas device 20 can be connected to the exhaust gas line 5 or separated from the exhaust gas line 5.

The second exhaust gas device 20 has a second treatment member 28 in the form of a cooling trap, which can be cooled to 77° K in order to freeze out the treatment gas. Another pressure sensor 23' is disposed downstream from the second treatment member 28 in order to determine the total pressure $P'_T$ downstream from the exhaust gas device 20.

An adjustable throttle valve 25 is disposed upstream from a second vacuum pump 26 in order to adjust the pump output of the second vacuum pump 26. A second scrubber 27 is located downstream from the second vacuum pump.

During the deposition process, the second check valve 21 is closed and the first check valve 11 is open, so that the exhaust gas, which particularly contains $NH_3$, flows through the exhaust gas line 5 into the first exhaust gas treatment device 10. Particles that are present in the exhaust gas flow are filtered out in the particle filter 18. Residual gas not broken down passes through the vacuum pump 16 into the gas treatment 17. During the deposition process, the two pressure sensors 13, 23 supply pressure values on the total pressure in the first exhaust gas device 10 and the second exhaust gas device 20 to a control device 9. The control device 9 also receives the total pressure $P_R$ within the process chamber from the pressure sensor. By varying the position of the throttle flap of the throttle valve 15, the total pressure in the process chamber is maintained at a target value.

After the deposition process, a switching phase occurs. The objective of the switching phase is to separate the first exhaust gas device 10 through separation of the check valve 11 from the exhaust gas line 5 and to connect the second exhaust gas device 20 to the exhaust gas line 5 by opening the check valve 21.

At the beginning of the switching phase, the command variable of the pressure regulation is changed. Instead of the total pressure $P_R$ in the process chamber, the total pressure $P_F$ in the first exhaust gas device is now kept at a constant value. This is done either by varying the mass flow of the equalizing gas fed in through the mass flow controller 12' or by varying the position of the throttle flap of the throttle valve 15.

At the beginning of the switching phase, the mass flow of the equalizing gas, which is fed through the mass flow controller 22' at the feed point 22 in the second exhaust gas device 20, is set to a value that corresponds to the mass flow that is flowing through the throttle valve 15 of the first exhaust gas device 10. When the equalization flow is small, this is substantially the mass flow that is also flowing through the process chamber of the reactor 3. The total pressure $P_T$ in the second exhaust gas device 20 is then regulated to the total pressure $P_F$ of the first exhaust gas device 10. In other words, the total pressures $P_F$, $P_T$ in the two exhaust gas devices 10, 20 are regulated to the same value.

As soon as the total pressures $P_F$, $P_T$ in the two exhaust gas devices 10, 20 have stabilized, the check valve 21 can be opened. As soon as the valve 21 is completely open, the check valve 11 of the first exhaust gas device 10 is closed. For a brief moment, both exhaust gas devices 10, 20 are thus fluidly connected to the exhaust gas line 5. Due to the identity of the total pressures on both sides, only minimum cross flow occurs.

At the same time as the closing of the first check valve 11 of the first exhaust gas device, the mass flow of the equalizing gas that is fed in at the feed point 22 in the second exhaust gas device 20 is reduced to a minimum so that, upon switching of the valve arrangement, that is, upon opening of the second check valve 21 and upon closing of the first check valve 11, the positions of the two throttle valves 15, 25 are substantially equal.

By virtue of the pressure equilibrium, no cross flow occurs upon switching. The chlorine used in the cleaning of the process chamber is frozen out in the cooling trap 28. During the treatment step, the total pressure in the first exhaust gas device 10 is kept at the total pressure in the second exhaust gas device 20 by feeding equalizing gas at the feed point 12 into the first exhaust gas device.

Upon completion of the switching process, the control device 9 again receives the total pressure in the process chamber as a command variable, so that the pressure $P_R$ determined by the pressure regulator 4 is used to regulate the throttle valve 25. Here as well, it is possible to maintain the throttle valve 25 at a constant value and to perform the pressure regulation by varying the mass flow of the equalizing gas.

Upon completion of the treatment step, a switching phase occurs in which the total pressure within the active exhaust gas device 20 is first regulated to a constant value and the total pressure of the non-active exhaust gas device 10 is regulated to the same total pressure. Once pressure stability is reached, that is, once a state is reached in same total pressure is established in the two exhaust gas devices 10, 20, the check valve 11 of the passive exhaust gas device is opened and, as soon as it is open, the check valve 21 of the active exhaust gas device 20 is closed. Subsequently, the switch is made, in turn, for the regulation of the total pressure within the process chamber.

In the passive exhaust gas device, the mass flow of the equalization flow fed in there at the feed points 22 or 12 is maintained at a minimum value. Nonetheless, the total pressure within the passive exhaust gas device is maintained by the control device 9 at the value of the total pressure in the active exhaust gas device.

Figure 2:
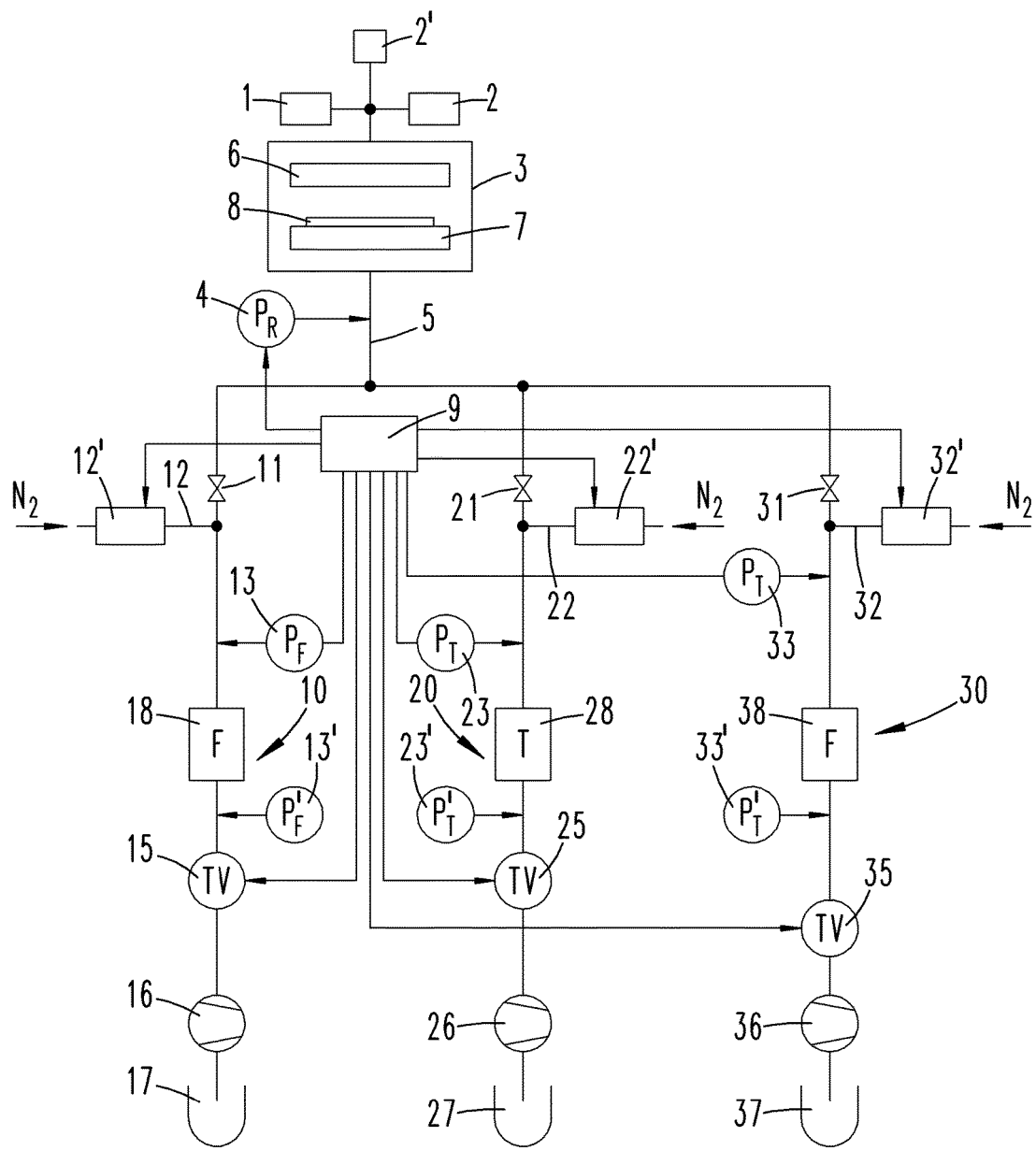
FIG. 2 shows a representation according to FIG. 1, but with three exhaust gas treatment devices 10, 20, 30 arranged parallel next to each other.

In the second exemplary embodiment shown in FIG. 2, a third exhaust gas treatment device 30 has been added to the embodiment shown in FIG. 1, the structure of which corresponds substantially to the structure of the first exhaust gas treatment device 10. The third exhaust gas treatment 30 has a third check valve 31 that is connected in parallel to the check valves 11, 21. A third equalizing gas is fed in a mass flow-controlled manner into the exhaust gas device 30 at a feed point 32 by means of a third mass flow controller 32'. The third exhaust gas device 30 has a particle filter as the third treatment member 38. A third pressure sensor 33 for determining the total pressure within the third exhaust gas device is located upstream from the particle filter 38. The third pressure sensor 33 delivers its value to the control device which, in turn, controls the third mass flow controller 32' in such a way that the total pressure within the exhaust gas device 30 corresponds to the total pressure of the two other exhaust gas devices 10, 20.

Another pressure sensor 33' is located downstream from the treatment member 38. Furthermore, a third throttle valve 35 that determines the pump output of a third vacuum pump 36 is located downstream from the treatment member 38. The third throttle valve 35 is also adjustable. A third scrubber 37 is located downstream from the third vacuum pump 36.

Figure 3:
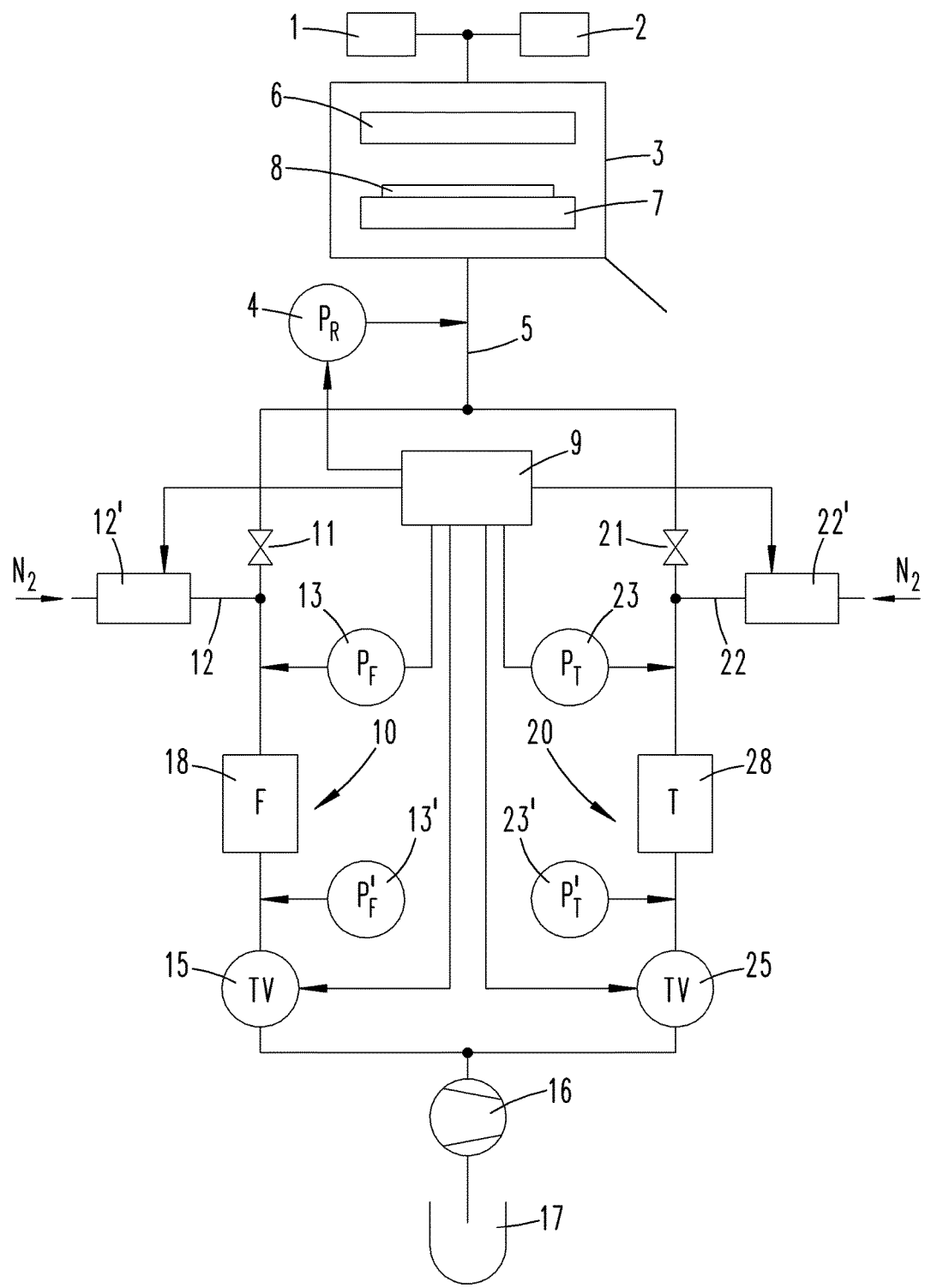
FIG. 3 shows a representation according to FIG. 1 of a third exemplary embodiment, in which a common vacuum pump 16 is respectively arranged downstream from a throttle valve 15, 25.

Unlike in the first exemplary embodiment, only one vacuum pump 16 is used in the third exemplary embodiment shown in FIG. 3. The sole vacuum pump 16 is arranged downstream from the two throttle valves 15, 25. A common scrubber 17 is located downstream from the vacuum pump 16.

Figure 4:
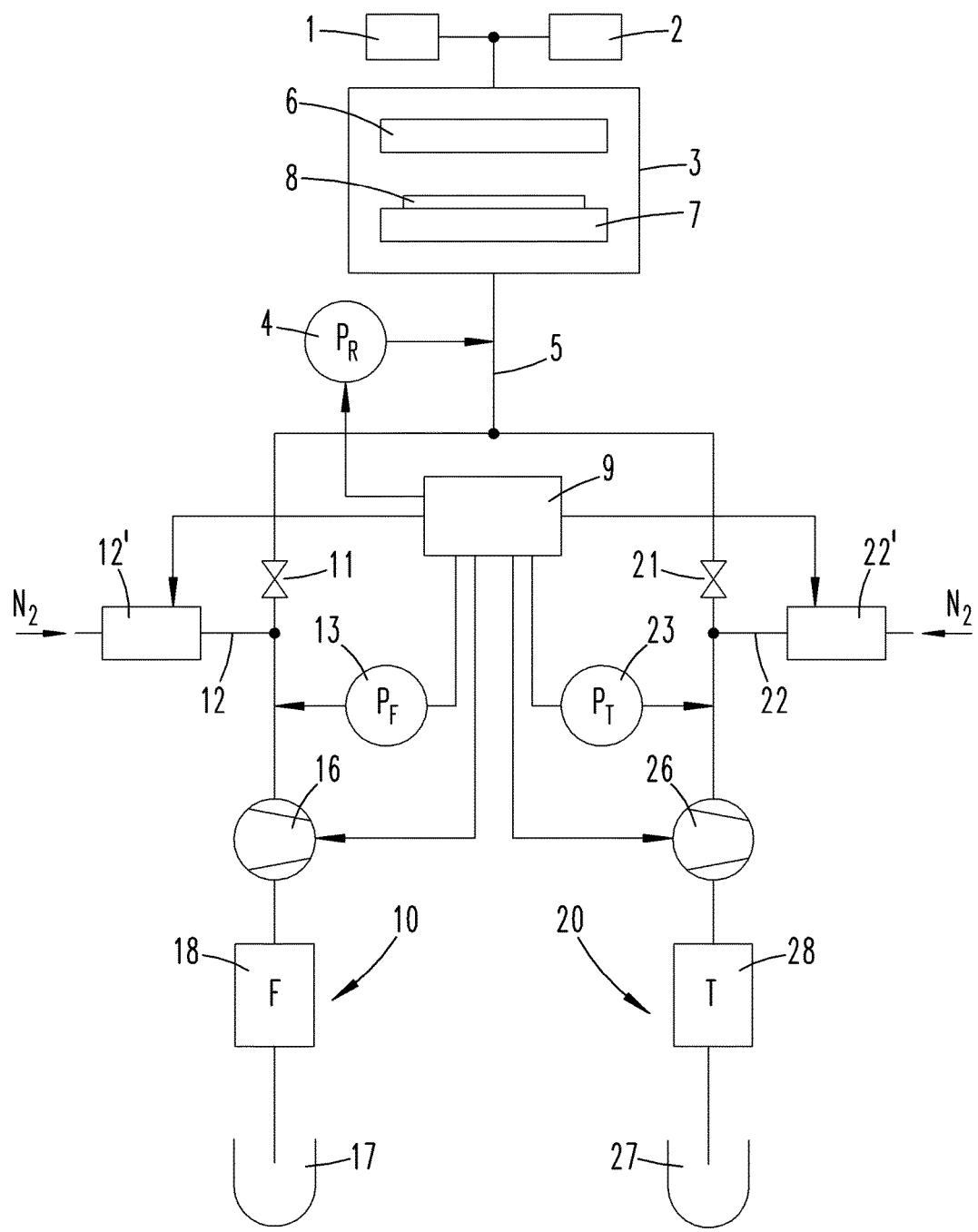
FIG. 4 shows a fourth exemplary embodiment of the invention, in which the treatment members 18, 28 are arranged downstream from the vacuum pumps 16, 26, respectively.

In the fourth exemplary embodiment shown in FIG. 4, the vacuum pumps 16, 26 are located upstream from the treatment members 18, 28 but downstream from the gas feed points 12, 22. The vacuum pumps 16, 26 pump here with a constant pump output. The pressure downstream from the check valves 11, 21 is adjusted here by varying the mass flows of the two equalizing gases.

The exemplary embodiment shown in FIG. 4 can be modified to the effect that a throttle valve 11, 21 with which the total pressure can be regulated by the control device 9 is arranged upstream from the vacuum pump 16 or upstream from the vacuum pump 26 but downstream from the measurement points at which the total pressure $P_F$ or $P_T$ is measured.

In the exemplary embodiment shown in FIG. 5, only one adjustable throttle valve 15 is used upstream of a single vacuum pump 16. Substantially only the total pressure in the first exhaust gas device 10 can be influenced with the throttle valve 15. The second exhaust gas device 20 has a throttle valve 25 set to a fixed value. Here, too, an equalizing gas regulated by a regulator 9 is fed in at feed points 12, 22 in order to enable adjustment of the total pressure in the exhaust gas device, which is particularly separated from the exhaust gas line 5.

The above remarks are intended to explain the inventions encompassed overall by the invention, each of which independently develops the prior art through the following combinations of features, namely:

A device that is characterized in that process gases different from one another can be fed into a reactor 3 during process steps different from one another and the reactor 3 has an exhaust gas line 5 through which the exhaust gases different from one another can be conveyed out of the reactor 3 in process steps different from one another, with a first exhaust gas device 10 that can be connected by means of a valve arrangement 11, 21 to the exhaust gas line 5 in a fluidly communicable and separable manner, with a first treatment member 18 for treating an exhaust gas produced in a first of the process steps different from one another, with a first gas feed device 12 arranged between the valve arrangement 11, 21 and the first treatment member 18 for feeding in a first equalizing gas, with a first pressure sensor 13 for determining the total pressure $P_F$ in the first exhaust gas device 10 and with a second exhaust gas device 20 that can be connected by means of the valve arrangement 11, 21 to the exhaust gas line 5 in a fluidly communicable and separable manner, with a second treatment member 28 for treating an exhaust gas produced in a second of the process steps different from one another, with a second gas feed device 22 arranged between the valve arrangement 11, 21 and the second treatment member 28 for feeding in a second equalizing gas, with a second pressure sensor 23 for determining the total pressure in the second exhaust gas device 20, a control device 9 being provided whose control variable is the pressure difference between the total pressure $P_F$ in the first exhaust gas device 10 and the total pressure $P_T$ in the second exhaust gas device 20 and is set up such that the pressure difference is regulated toward zero at least during switching of the valve arrangement 11, 21.

A method or control program which is characterized in that, to operate a reactor 3 into which process gases different from one another can be fed in during process steps different from one another and in which exhaust gases different from one another can be conveyed out of the reactor 3 through an exhaust gas line 5, wherein, in a first process step, a first exhaust gas device 10 is fluidly connected by means of a valve arrangement 11, 21 to the exhaust gas line 5 and at least one second exhaust gas device 20 is separated therefrom, wherein the first exhaust gas is treated with a first treatment member 18 of the first exhaust gas device 10 and a first equalizing gas is fed by means of a first gas feed device 12 particularly having a first mass flow controller 12' between the valve arrangement 11, 21 and the first treatment member 18, and the total pressure $P_F$ in the first exhaust gas device 10 is determined with a first pressure sensor 13, wherein, in a second process step, a second exhaust gas device 20 is fluidly connected by means of the valve arrangement 11, 21 to the exhaust gas line 5 and at least one first exhaust gas device 10 is separated therefrom, wherein the second exhaust gas is treated with a second treatment member 28 of the second exhaust gas device 20, and a second equalizing gas is fed by means of a second gas feed device 22 particularly having a second mass flow controller 22' between the valve arrangement 11, 21 and the second treatment member 28, and the total pressure $P_T$ in the second exhaust gas device 20 is determined with a second pressure sensor 23, wherein the pressure difference between the total pressure $P_F$ in the first exhaust gas device 10 and the total pressure $P_T$ in the second exhaust gas device 20 is regulated by means of a control device 9 toward zero at least during switching of the valve arrangement.

A device or a method which is characterized in that the first or second equalizing gas is each an inert gas, particularly nitrogen.

A device or a method which is characterized in that the actuating elements of the control device 9 are the mass flow controller 12', 22' and/or one or more throttle valves 16, 26 arranged upstream from a pump 16, 26.

A device or a method which is characterized in that the first treatment member 18 is a filter and/or the second treatment member 28 is a cooling trap.

A control device for controlling an operating sequence of a method, characterized in that a process step, particularly the first process step, is a substrate-coating step in which particularly a hydride, particularly $NH_3$ is fed into the reactor 3.

A control device which is characterized in that a process step, particularly the second process step, is a treatment step in which a halogen-containing gas, particularly $Cl_2$, is fed into the reactor 3.

A device or a method which is characterized by a third exhaust gas device 30 that is fluidly communicable with the exhaust gas line 5 by means of the valve arrangement 11, 21 and separable therefrom, with a third treatment member 38, with a third gas feed device 32 particularly having a third mass flow controller 32' for feeding in a third equalizing gas and a third pressure sensor 33 for determining the total pressure in the third exhaust gas device 30, the control device 9 regulating the total pressure in the third exhaust gas device 30 against the total pressure in the first or second exhaust gas device 10, 20.

A device or a method which is characterized in that all of the exhaust gas devices 10, 20, 30 each have a throttle valve 15, 25, 35 and/or that at least one exhaust gas device 10, 20, 30 does not have a throttle valve 15, 25, 35.

A device or a method which is characterized in that the valve arrangement 11, 21, 31 has two or three separately switchable individual valves 11, 21, 31 that are connected upstream to the exhaust gas line 5 and downstream to the exhaust gas device 10, 20, 30.

A device or a method which is characterized in that the pressure sensor 13, 23, 33 is arranged upstream from the treatment member 18, 28, 38 and particularly between gas feed device 12, 22, 32 and treatment member 18, 28, 38.

A device or a method which is characterized by another pressure sensor 13', 23', 33' arranged downstream from the treatment member 18, 28, 38 for determining a total pressure in the exhaust gas device 10, 20, 30.

A device or a method which is characterized in that each of the exhaust gas devices 10, 20, 30 has one of the respective gas treatments 17, 27, 37 arranged downstream from the respective vacuum pump 16, 26, 36 in the direction of flow.

A control device for controlling an operating sequence of a method, characterized in that, during the first process step, a process chamber pressure $P_R$ determined by a pressure sensor 4 is maintained at a target value by the control device 9 particularly by varying the position of a throttle valve 15; that, before the switch from the first process step to the second process step, the total pressure $P_F$ of the first exhaust gas device 10 and the total pressure $P_T$ of the second exhaust gas device 20 are each regulated to the same target value; that, after a stabilization of the total pressures $P_F$, $P_T$ in the two exhaust gas devices 10, 20, a check valve 21 of the valve arrangement connecting the second exhaust gas device 20 to the exhaust gas line 5 is first opened and a check valve 11 of the valve arrangement connecting the first exhaust gas device 10 to the exhaust gas line 5 is then closed; and that, thereafter, the control device 9 regulates the process chamber pressure $P_R$ determined by the pressure sensor 4 to a target value by varying the position of a throttle valve 25.

All of the disclosed features are essential to the invention, whether alone or in combination with each other. The disclosed content of the associated/enclosed priority documents (copy of prior application) is hereby included herein in its entirety, also for the purpose of including features of these documents in claims of the present application. The subclaims characterize with their features independent inventive developments of the prior art, particularly for the purpose of pursuing divisional applications on the basis of these claims.

LIST OF REFERENCE SYMBOLS

| | |
|---|---|
| 1 | gas source |
| 2 | gas source |
| 2' | gas source |
| 3 | reactor |
| 4 | pressure sensor |
| 5 | exhaust gas line |
| 6 | gas inlet member |
| 7 | susceptor |
| 8 | substrate |
| 9 | control device |
| 10 | exhaust gas treatment device |
| 11 | check valve/valve arrangement |
| 12 | gas feed device |
| 12' | mass flow controller |
| 13 | pressure sensor |
| 13' | pressure sensor |
| 14 | |
| 15 | throttle valve |
| 16 | vacuum pump |
| 17 | gas treatment/scrubber |
| 18 | filter/treatment member |
| 19 | |
| 20 | exhaust gas treatment device |
| 21 | check valve/valve arrangement |
| 22 | gas feed device |
| 22' | mass flow controller |
| 23 | pressure sensor |
| 23' | pressure sensor |
| 24 | |
| 25 | fixed-value throttle/throttle valve |
| 26 | vacuum pump |
| 27 | gas treatment/scrubber |
| 28 | cooling trap/treatment member |
| 29 | |
| 30 | exhaust gas treatment device |
| 31 | check valve/valve arrangement |
| 32 | gas feed device |
| 32' | mass flow controller |
| 33 | pressure sensor |
| 33' | pressure sensor |
| 34 | |
| 35 | throttle valve |
| 36 | vacuum pump |
| 37 | gas treatment/scrubber |
| 38 | filter/treatment member |
| $P_F$ | first total pressure |
| $P_R$ | process chamber pressure |
| $P_T$ | second total pressure |

What is claimed is:

1. A method, comprising:
   in a first process step:
     feeding a first process gas into a reactor (3);
     conveying a first exhaust gas out of the reactor (3) through an exhaust gas line (5);
     conveying the first exhaust gas from the exhaust gas line (5) through a valve arrangement (11, 21) to a first exhaust gas device (10) with a first treatment member (18);
     treating the first exhaust gas with the first treatment member (18);
     feeding a first equalizing gas by means of a first gas feed device (12) into a gas conduit disposed between the valve arrangement (11, 21) and the first treatment member (18), wherein the first gas feed device (12) includes a first mass flow controller (12'); and
     determining a total pressure ($P_F$) in the first exhaust gas device (10) with a first pressure sensor (13); and
   in a second process step:
     feeding a second process gas into the reactor (3);
     conveying a second exhaust gas out of the reactor (3) through the exhaust gas line (5);
     conveying the second exhaust gas from the exhaust gas line (5) through the valve arrangement (11, 21) to a second exhaust gas device (20) with a second treatment member (28);
     treating the second exhaust gas with the second treatment member (28);
     feeding a second equalizing gas by means of a second gas feed device (22) into a gas conduit disposed between the valve arrangement (11, 21) and the second treatment member (28), wherein the second gas feed device (22) includes a second mass flow controller (22'); and
     determining a total pressure ($P_T$) in the second exhaust gas device (20) with a second pressure sensor (23); and
   regulating a difference between the total pressure ($P_F$) in the first exhaust gas device (10) and the total pressure ($P_T$) in the second exhaust gas device (20) by means of a control device (9) toward zero at least during switching of the valve arrangement while the first and second exhaust gas devices (10, 20) are both fluidly coupled to the exhaust gas line (5) so as to prevent the first exhaust gas from flowing into the second exhaust gas device (20) and prevent the second exhaust gas from flowing into the first exhaust gas device (10).

2. The method of claim 1, wherein actuating elements of the control device (9) comprise the first and second mass flow controllers (12', 22') and/or one or more throttle valves (16, 26) arranged upstream from a pump (16, 26).

3. The method of claim 1, further comprising:
   during the first process step, maintaining a pressure ($P_R$) of the reactor (3) determined by a third pressure sensor (4) at a first value by the control device (9) by varying a position of a first throttle valve (15);

before switching from the first process step to the second process step, regulating the total pressure ($P_F$) of the first exhaust gas device (10) and the total pressure ($P_T$) of the second exhaust gas device (20) both to a second value;

after a stabilization of the total pressures ($P_F$, $P_T$) in the two exhaust gas devices (10, 20), opening a check valve (21) of the valve arrangement connecting the second exhaust gas device (20) to the exhaust gas line (5) and then closing a check valve (11) of the valve arrangement connecting the first exhaust gas device (10) to the exhaust gas line (5); and thereafter, regulating by the control device (9) the reactor pressure ($P_R$) determined by the third pressure sensor (4) to a third value by varying a position of a second throttle valve (25).

4. A method for operating a system, the system comprising (i) a reactor with an exhaust gas line, (ii) a first exhaust gas device with a first treatment member, (iii) a first check valve for controlling whether an exhaust gas flows from the exhaust gas line into the first exhaust gas device, (iv) a second exhaust gas device with a second treatment member, (v) a second check valve for controlling whether the exhaust gas flows from the exhaust gas line into the second exhaust gas device, (vi) a first gas feed device configured to feed a first equalizing gas into a gas conduit disposed between the first exhaust gas device and the first check valve, and (vii) a second gas feed device configured to feed a second equalizing gas into a gas conduit disposed between the second exhaust gas device and the second check valve, the method comprising:

performing a first process step during which the exhaust gas flows from the exhaust gas line through the first check valve and into the first exhaust gas device;

at a beginning of a switching phase that switches from the first process step to a second process step, setting a mass flow of the second equalizing gas equal to a value that corresponds to a mass flow that is flowing through the first exhaust gas device so as to equalize a total pressure in the first exhaust gas device and a total pressure in the second exhaust gas device;

as soon as the total pressure in the first exhaust gas device equals the total pressure in the second exhaust gas device, opening the second check valve, causing the first exhaust gas device and the second exhaust gas device to both be fluidly coupled to the exhaust gas line, wherein by flowing the second equalizing gas through the second exhaust gas device, the exhaust gas is prevented from flowing into the second exhaust gas device while the first exhaust gas device and the second exhaust gas device are both fluidly coupled to the exhaust gas line; and after the opening of the second check valve, closing the first check valve and reducing the mass flow of the second equalizing gas, thereby directing the exhaust gas to flow from the exhaust gas line through the second check valve and into the second exhaust gas device.

* * * * *